(12) United States Patent
Nagata et al.

(10) Patent No.: US 10,393,771 B2
(45) Date of Patent: Aug. 27, 2019

(54) EXCHANGEABLE CONTACT UNIT AND INSPECTION JIG

(71) Applicant: YOKOWO CO., LTD., Kita-ku (JP)

(72) Inventors: Takahiro Nagata, Tomioka (JP);
Takeshi Todoroki, Tomioka (JP);
Takahiro Nakamura, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 0 days.

(21) Appl. No.: 14/979,905

(22) Filed: Dec. 28, 2015

(65) Prior Publication Data

US 2016/0187378 A1   Jun. 30, 2016

(30) Foreign Application Priority Data

Dec. 26, 2014   (JP) .................................. 2014-265836

(51) Int. Cl.
| | | |
|---|---|---|
| *G01R 1/04* | (2006.01) | |
| *G01R 1/067* | (2006.01) | |
| *G01R 31/319* | (2006.01) | |
| *G01R 31/28* | (2006.01) | |

(52) U.S. Cl.
CPC ......... *G01R 1/0416* (2013.01); *G01R 1/0408* (2013.01); *G01R 1/067* (2013.01); *G01R 31/2886* (2013.01); *G01R 31/31905* (2013.01)

(58) Field of Classification Search
CPC ... G01R 1/0408–07392; G01R 31/2886–2891; G01R 31/319–31937; G01R 35/00
See application file for complete search history.

(56) References Cited

U.S. PATENT DOCUMENTS

| | | | | |
|---|---|---|---|---|
| 3,879,103 | A | * 4/1975 | Peltola | H01R 9/0515 |
| | | | | 439/581 |
| 4,912,399 | A | 3/1990 | Greub et al. | |
| 5,559,446 | A | * 9/1996 | Sano | G01R 1/0735 |
| | | | | 29/832 |
| 5,747,994 | A | * 5/1998 | Suga | G01R 1/06705 |
| | | | | 324/750.01 |
| 5,752,839 | A | * 5/1998 | Fiacco | H01R 24/50 |
| | | | | 439/63 |
| 6,099,334 | A | * 8/2000 | Togashi | H01R 13/703 |
| | | | | 200/51.1 |

(Continued)

FOREIGN PATENT DOCUMENTS

| | | |
|---|---|---|
| JP | 64-4042 | 1/1989 |
| JP | 2001-183392 A | 7/2001 |

(Continued)

OTHER PUBLICATIONS

Extended European Search Report dated May 24, 2016 for corresponding European Patent Application No. 15202446.9.

(Continued)

*Primary Examiner* — Huy Q Phan
*Assistant Examiner* — David B Frederiksen
(74) *Attorney, Agent, or Firm* — Morgan, Lewis & Bockius LLP

(57) ABSTRACT

An exchangeable contact unit which can be attached to or detached from a main body of an inspection jig, includes: a flexible board which is provided with a contact part with respect to an object to be inspected; and a coaxial connector which is directly and electrically connected to the flexible board.

14 Claims, 14 Drawing Sheets

(56) References Cited

U.S. PATENT DOCUMENTS

| | | | |
|---|---|---|---|
| 6,393,607 B1* | 5/2002 | Hughes | H03H 7/482 333/126 |
| 6,433,563 B1* | 8/2002 | Maruyama | G01R 1/0408 324/754.07 |
| 6,621,710 B1* | 9/2003 | Cheng | H01R 13/22 324/756.03 |
| 7,262,590 B2* | 8/2007 | Nakajima | G01R 1/0408 324/750.25 |
| 10,024,883 B2* | 7/2018 | Nagata | G01R 1/06755 |
| 2001/0019276 A1* | 9/2001 | Yoshida | G01R 1/07342 324/755.01 |
| 2002/0008529 A1* | 1/2002 | Wilson | G01R 1/07314 324/756.03 |
| 2004/0008044 A1* | 1/2004 | Hohenwarter | G01R 1/06738 324/754.2 |
| 2004/0036490 A1* | 2/2004 | Schaeffer | G01R 1/07342 324/750.25 |
| 2005/0012513 A1* | 1/2005 | Cheng | G01R 1/07342 324/755.05 |
| 2006/0006892 A1 | 1/2006 | Green et al. | |
| 2006/0208752 A1* | 9/2006 | Tanioka | G01R 1/07342 324/755.01 |
| 2007/0069834 A1* | 3/2007 | Ikuta | H05K 1/0243 333/133 |
| 2007/0264872 A1* | 11/2007 | Kuroda | H01P 5/085 439/581 |
| 2008/0289862 A1* | 11/2008 | Yagisawa | H01L 23/057 174/254 |
| 2009/0093138 A1* | 4/2009 | Benham | H01R 23/688 439/63 |
| 2010/0026333 A1* | 2/2010 | Shouji | G01R 31/2889 324/756.03 |
| 2010/0127725 A1 | 5/2010 | Smith | |
| 2012/0168964 A1* | 7/2012 | Kim | G01R 1/07307 257/777 |
| 2013/0115810 A1* | 5/2013 | Maruyama | H01R 24/50 439/578 |
| 2013/0244486 A1* | 9/2013 | Ohsaka | H01R 12/57 439/581 |
| 2017/0074902 A1* | 3/2017 | Nagata | G01R 31/2889 |

FOREIGN PATENT DOCUMENTS

| | | |
|---|---|---|
| JP | 2001-208777 A | 8/2001 |
| JP | 2008-82734 A | 4/2008 |

OTHER PUBLICATIONS

Japanese Office Action in corresponding Japanese Patent Application No. 2014-265836 dated Aug. 22, 2018 along with English machine translation of same.

* cited by examiner

EXCHANGEABLE CONTACT UNIT AND INSPECTION JIG

CROSS-REFERENCE TO RELATED APPLICATION(S)

This application is based upon and claims the benefit of priority from prior Japanese patent application No. 2014-265836, filed on Dec. 26, 2014, the entire contents of which are incorporated herein by reference.

BACKGROUND

The present invention relates to an exchangeable contact unit and an inspection jig such as a probe card which are used for inspecting electrical performance of a semiconductor integrated circuit, for example.

An inspection jig such as a probe card which is used for inspecting electrical performance of a semiconductor integrated circuit includes a main board, and a flexible board which is bonded to the main board by soldering or so. The flexible board is provided with a contact part which is adapted to be contacted with an electrode of an object to be inspected (a wafer, for example). The flexible board is urged toward the object to be inspected from a back side of the contact part by means of a spring, thereby to be supplied with a contact force against the object to be inspected. The probe card having the above described structure is sometimes called as the probe card of a membrane type.

On occasion of inspecting the electrical performance, electric signals at high frequency are transmitted between the inspection jig and the inspection apparatus (a tester) by way of a coaxial cable. The inspection jig is provided with a coaxial connector for detachably connecting the coaxial cable which is extended from the tester. The coaxial connector is electrically connected to the flexible board by soldering or so, and is fixed (bonded) to the main board by soldering or so.

After contacts of about one million times, for example, have been repeated, the contact part of the flexible board wears, and the flexible board must be exchanged. In case where the flexible board and the main board are soldered to each other, the solder must be removed, when the flexible board is detached from the main board. Therefore, it requires technical skill and time to exchange the flexible board. JP-A-2001-208777 discloses such an art that a membrane assembly (the flexible board) in the probe card of a membrane type having a bump to come into contact with a pad of a wafer, which is the object to be inspected, can be easily exchanged.

The coaxial connector is not referred to, in JP-A-2001-208777. In case where the coaxial connector is fixed to the main board, and electrical connection between the flexible board and the coaxial connector is performed by pressure contact between the main board and the flexible board, exchange of the flexible board can be easily carried out. However, in this case, the electrical performance of the pressure contacted part is remarkably deteriorated.

SUMMARY

The present invention has been made in view of the above described circumstances, and an object of the invention is to provide an exchangeable contact unit which can be easily attached to or detached from an inspection jig such as a probe card, but can restrain deterioration of electrical performance in the inspection jig.

Another object of the invention is to provide an inspection jig in which a flexible board, which is a consumable supply, can be easily exchanged, while restraining deterioration of electrical performance.

According to the invention, in order to achieve the object, there is provided an exchangeable contact unit which can be attached to or detached from a main body of an inspection jig, the exchangeable contact unit comprising: a flexible board which is provided with a contact part with respect to an object to be inspected; and a coaxial connector which is directly and electrically connected to the flexible board.

The exchangeable contact unit may further comprise: a support board to which the coaxial connector is fixed.

The flexible board may be positioned on one face side of the support board, the coaxial connector may include: a body part which is positioned on the other face side of the support board; and a leg portion which is extended from the body part to pass through the support board and the flexible board, and which is electrically connected to the flexible board, and the contact unit may be detachably fixed to the main body of the inspection jig in such a manner that the flexible board is clamped between a board of the inspection jig and the support board.

A ground pattern which is electrically connected to a leg portion for ground of the coaxial connector may be provided on a face of the flexible board at an opposite side to the support board and extended up to a region around a through hole for fixing the flexible board to the main body of the inspection jig.

According to the invention, in order to achieve the object, there is provided an inspection jig comprising: a contact unit which includes: a flexible board provided with a contact part to be contacted with an object to be inspected; and a coaxial connector which is directly and electrically connected to the flexible board; a main board to which the contact unit is detachably fixed; and an urging member which is configured to apply a contact force with respect to the object to be inspected to the contact part, wherein the flexible board and the coaxial connector are not bonded to the main board.

The contact unit may be provided with a support board, and the coaxial connector may be fixed to the support board.

The flexible board may be clamped between the main board and the support board.

The main board, the flexible board and the support board may be fixed to each other by fastening components, ground patterns for the coaxial connector may be respectively provided on faces of the main board and the flexible board which are opposed to each other, so as to extend around fixed positions where they are fixed by the fastening components, and the ground patterns may be in face contact with each other, in regions around the fixed positions.

The inspection jig may further comprise: a unit pressing member which is fixed to the main board and is configured to support one end of the urging member. The flexible board may be positioned between the main board and the unit pressing member, and the unit pressing member may be provided with an elastic member for pressing the flexible board against the main board thereby to electrically connect them to each other.

The unit pressing member may be fixed to the main board by fastening components at both sides of the elastic member.

It is to be noted that optional combinations of the above described constituent elements, and descriptions of the present invention which are converted between methods and systems are also effective as features of the invention.

DETAILED DESCRIPTION OF EXEMPLARY EMBODIMENTS

Figure 1:
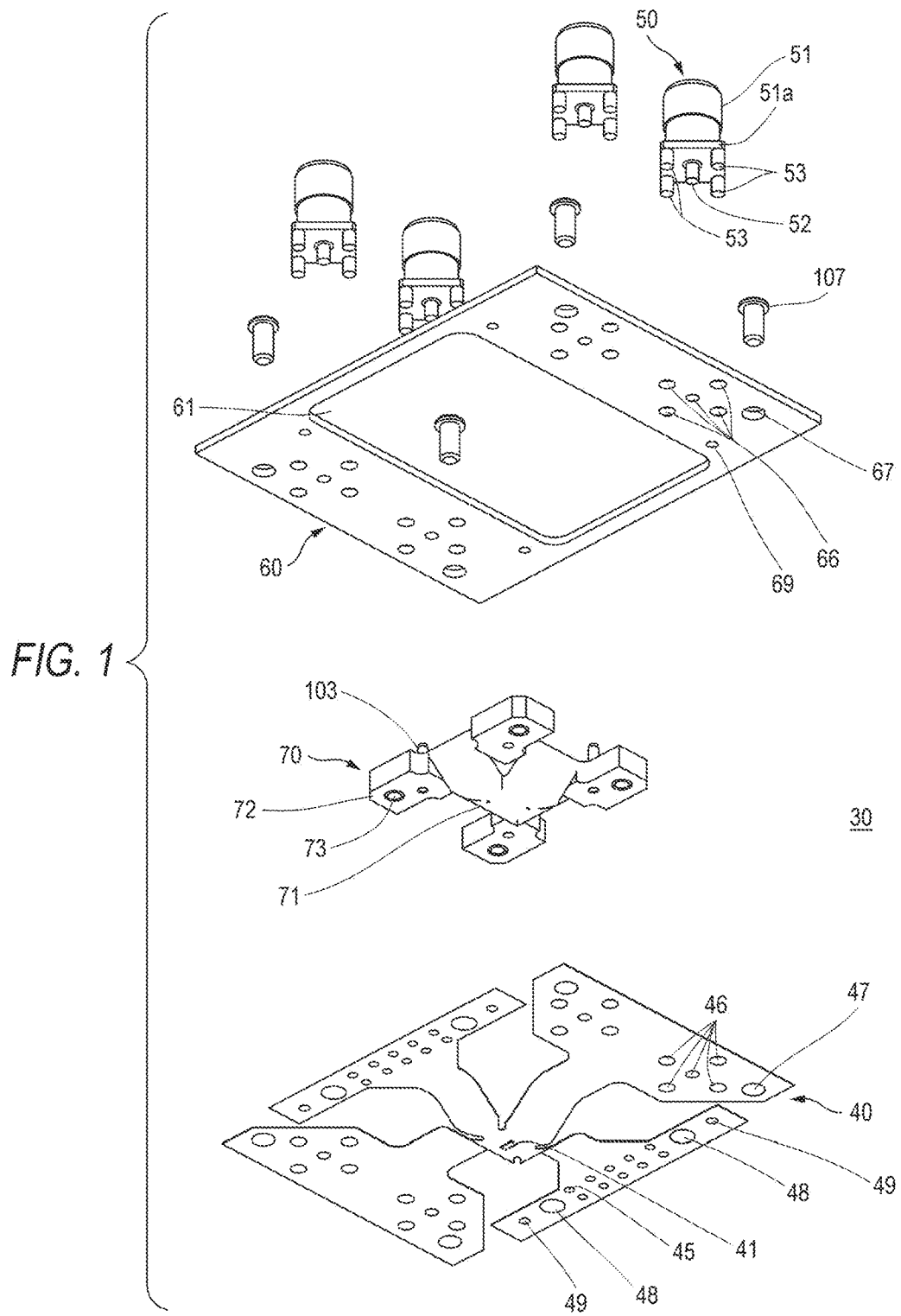
FIG. 1 is an exploded perspective view of a contact unit 30 in an embodiment according to the invention, as seen from the below.

Now, a preferred embodiment of the invention will be described in detail, referring to the drawings. It is to be noted that the same or equivalent constituent elements, members and so on which are shown in the respective drawings are denoted with the same reference numerals, and overlapped descriptions are appropriately omitted. Moreover, the invention is not limited to the embodiment, but the embodiment is only an example, and all features and combinations of the features which are described in the embodiment are not absolutely essential to the invention.

Figure 2:
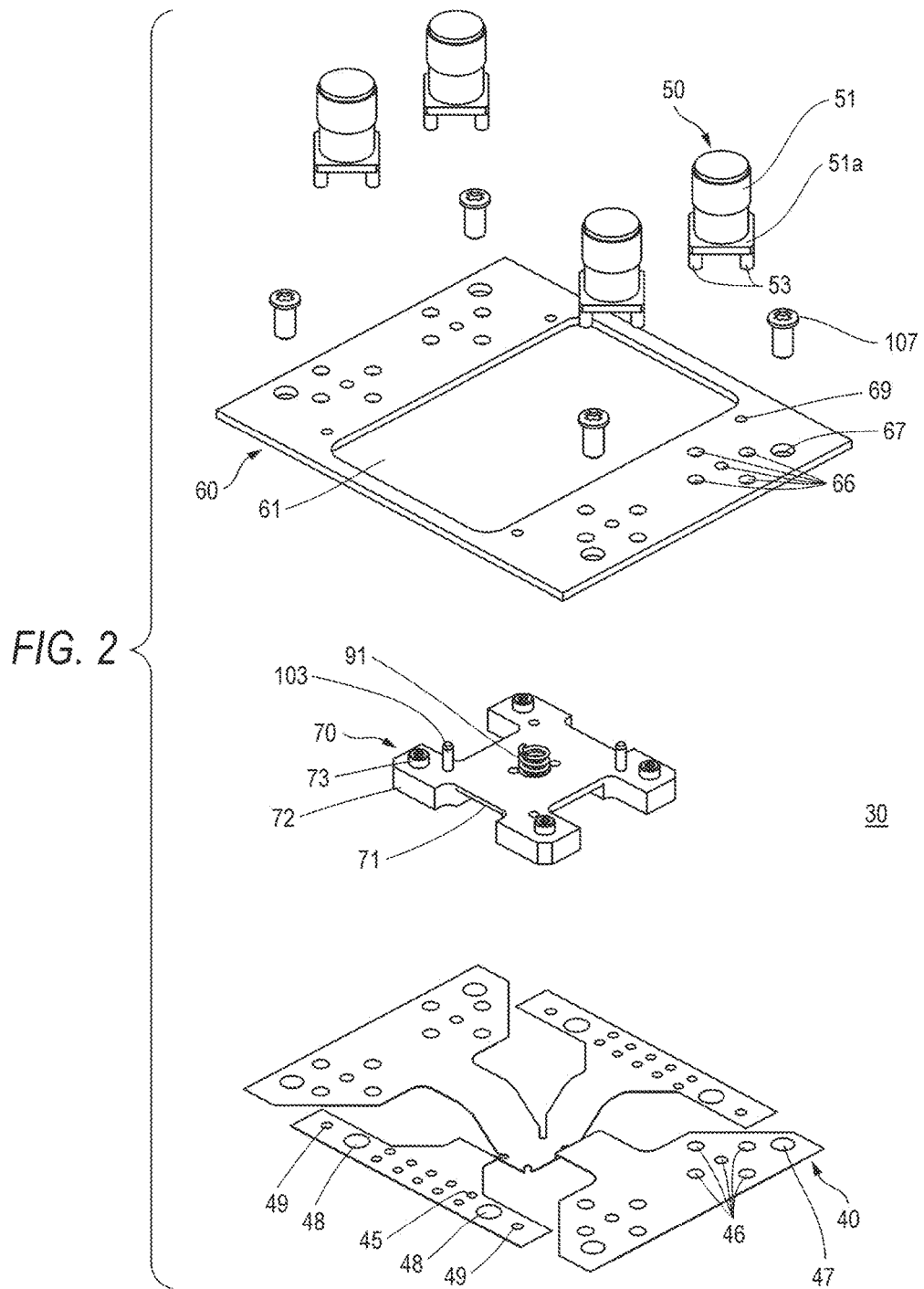
FIG. 2 is an exploded perspective view of the contact unit 30, as seen from the above.
Figure 3:
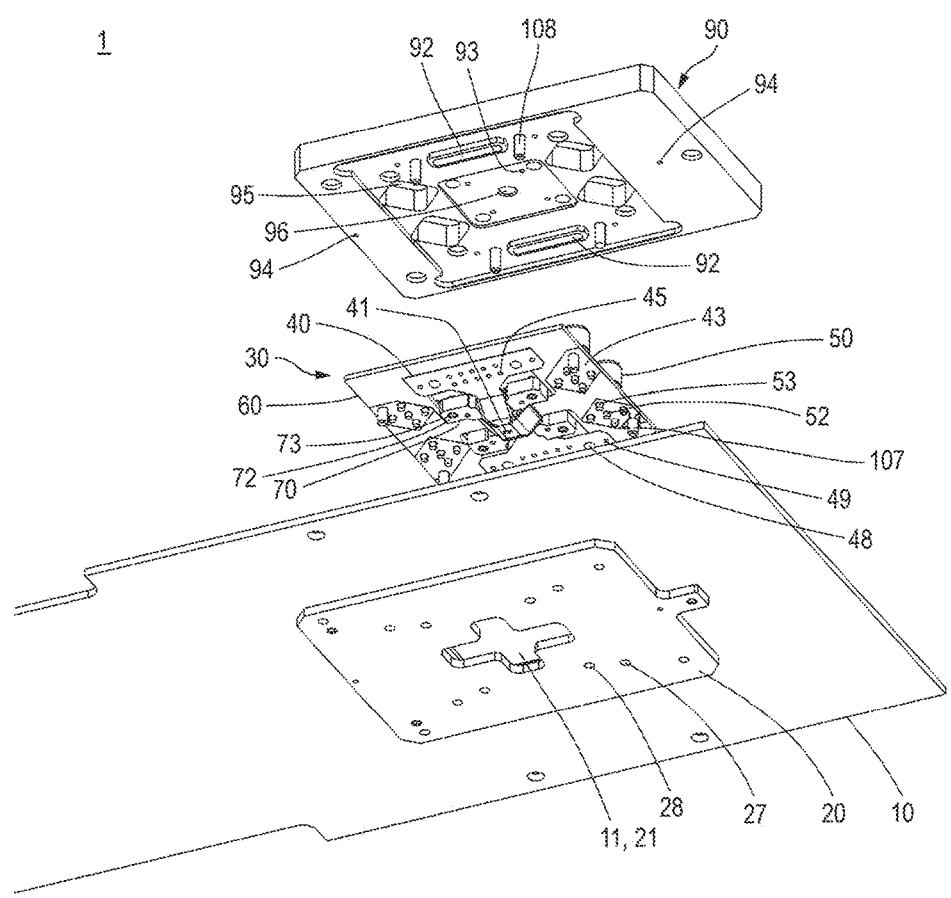
FIG. 3 is an exploded perspective view of an inspection jig 1 in the embodiment according to the invention, as seen from the below.
Figure 4:
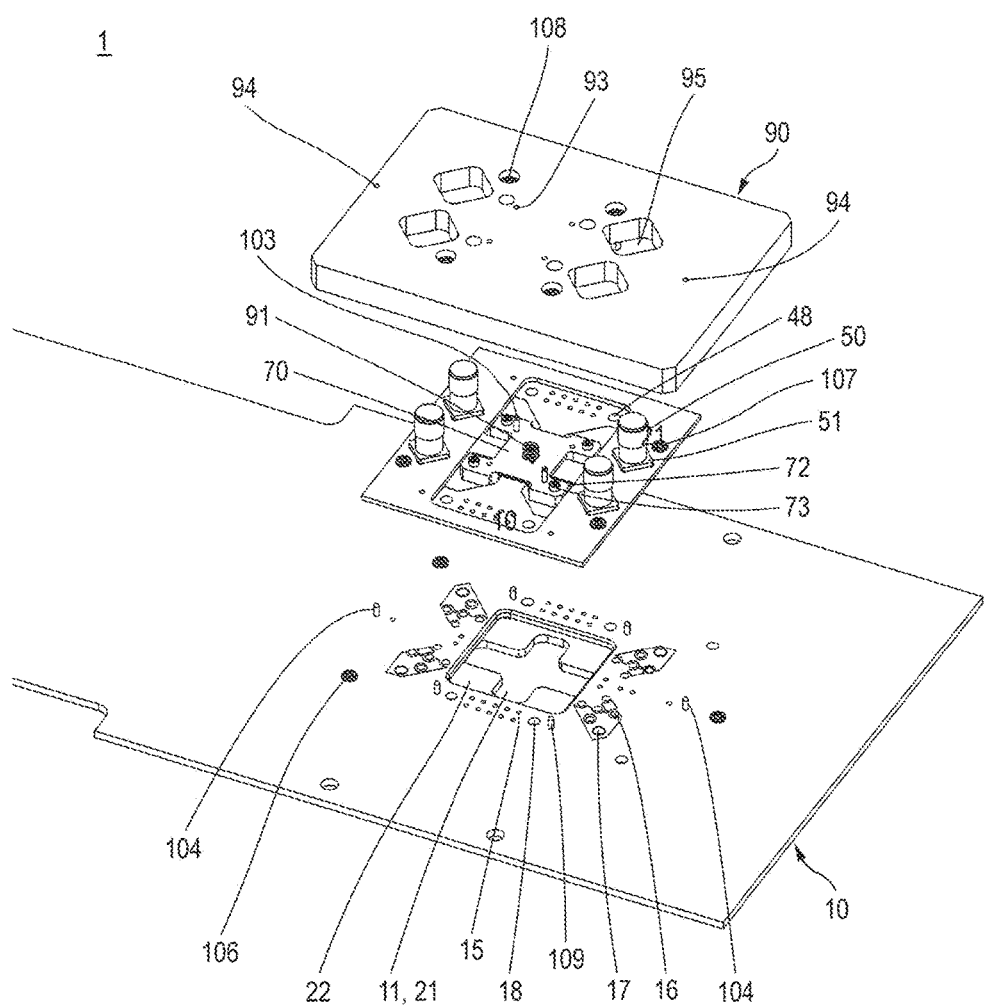
FIG. 4 is an exploded perspective view of the inspection jig 1, as seen from the above.
Figure 5:
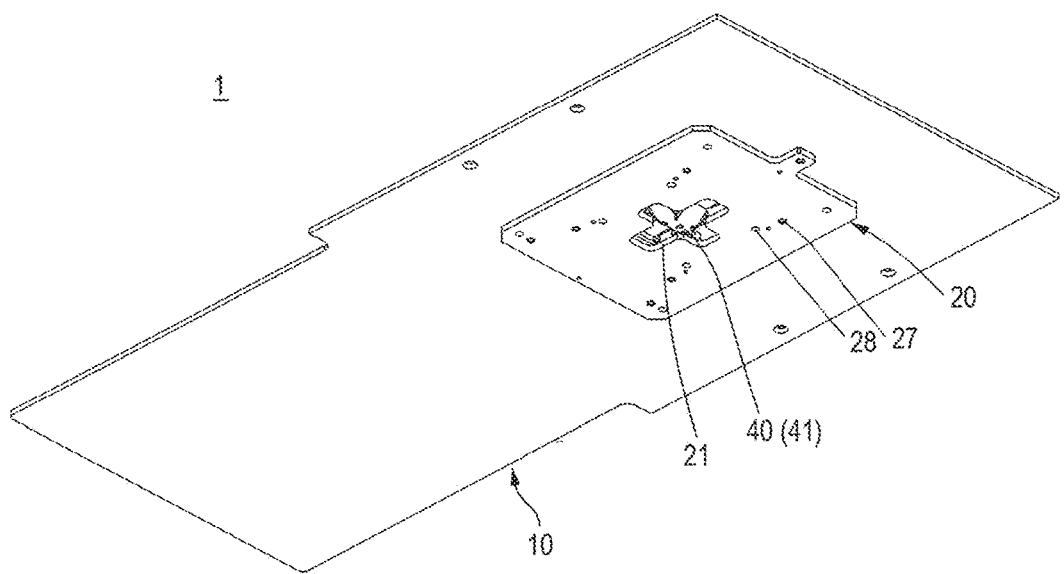
FIG. 5 is a perspective view of the inspection jig 1 in which a unit pressing member 90 is omitted, as seen from the below.
Figure 6:
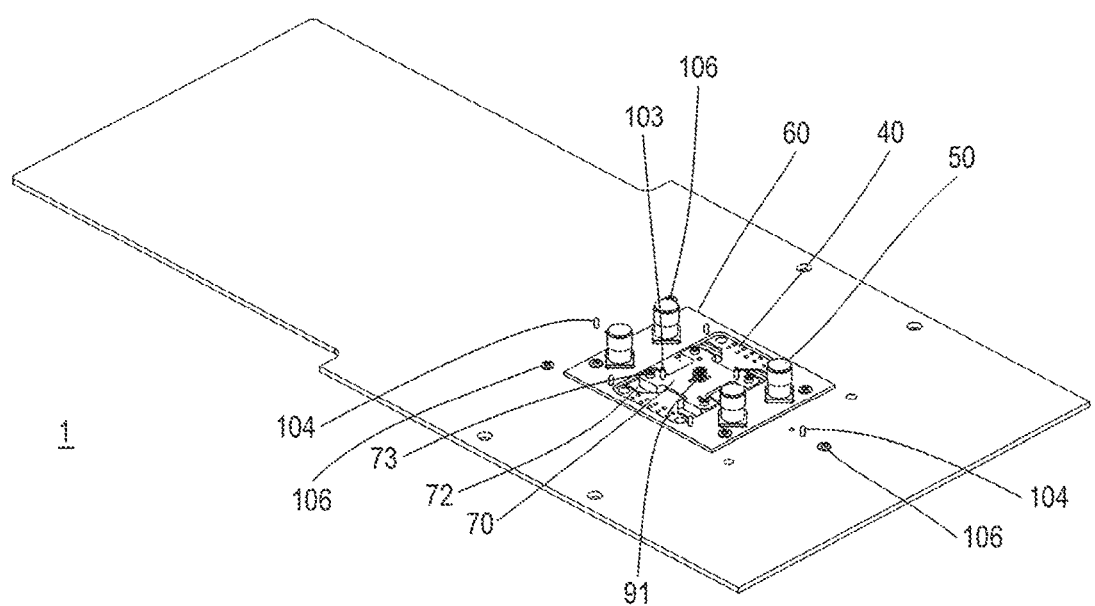
FIG. 6 is a perspective view of the inspection jig 1 in which the unit pressing member 90 is omitted, as seen from the above.
Figure 7:
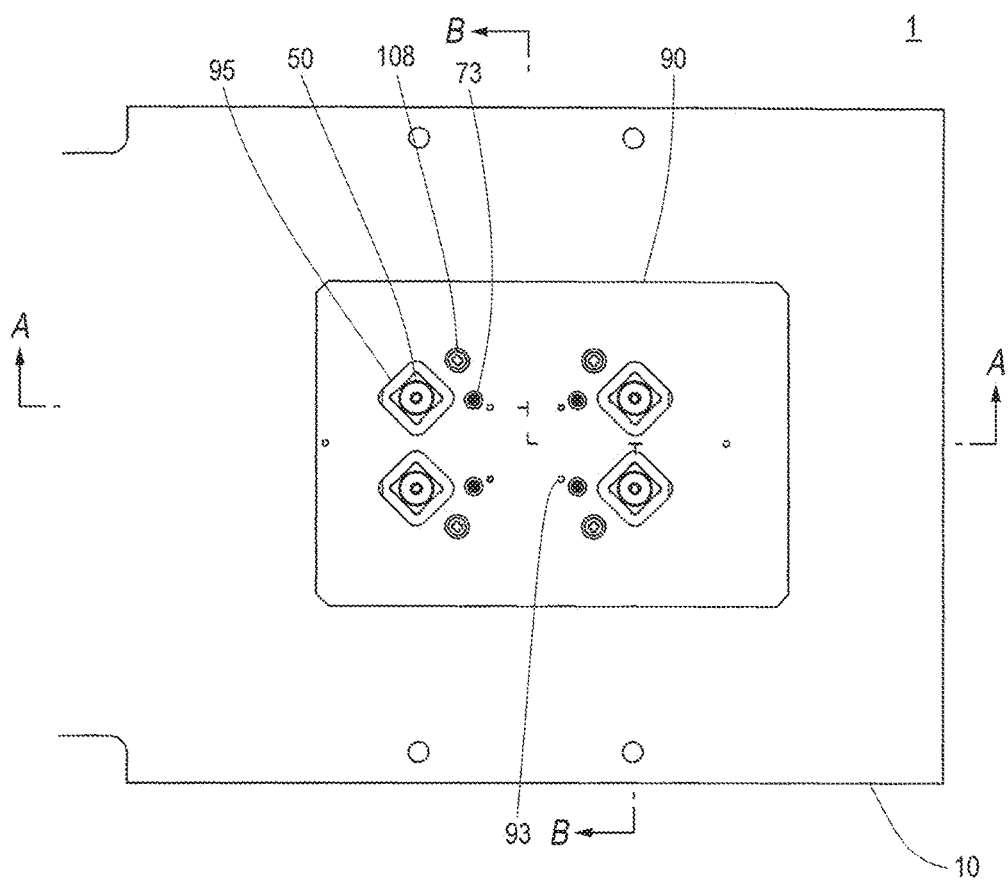
FIG. 7 is a plan view of the inspection jig 1.
Figure 8:
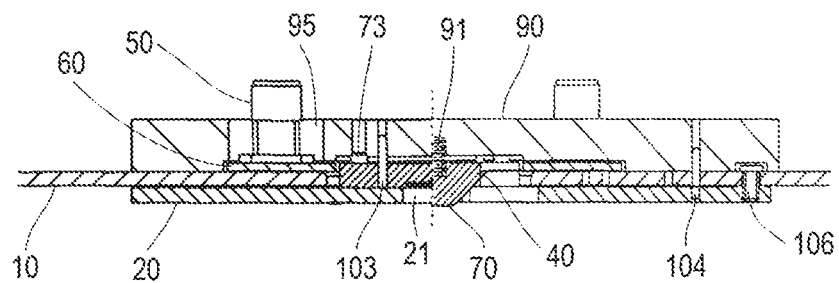
FIG. 8 is a sectional view taken along a line A-A in FIG. 7.
Figure 9:
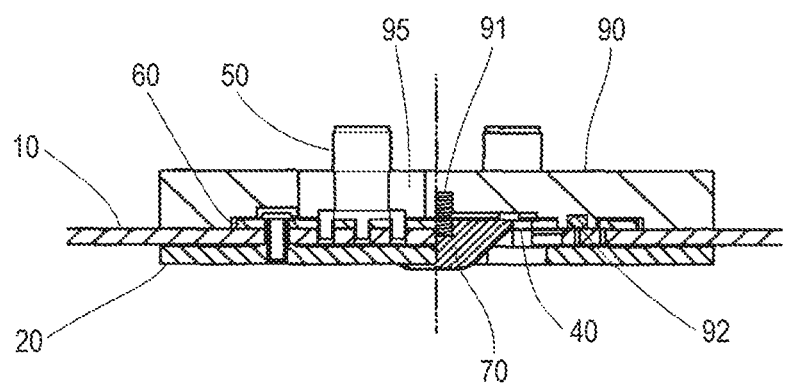
FIG. 9 is a sectional view taken along a line B-B in FIG. 7.
Figure 10:
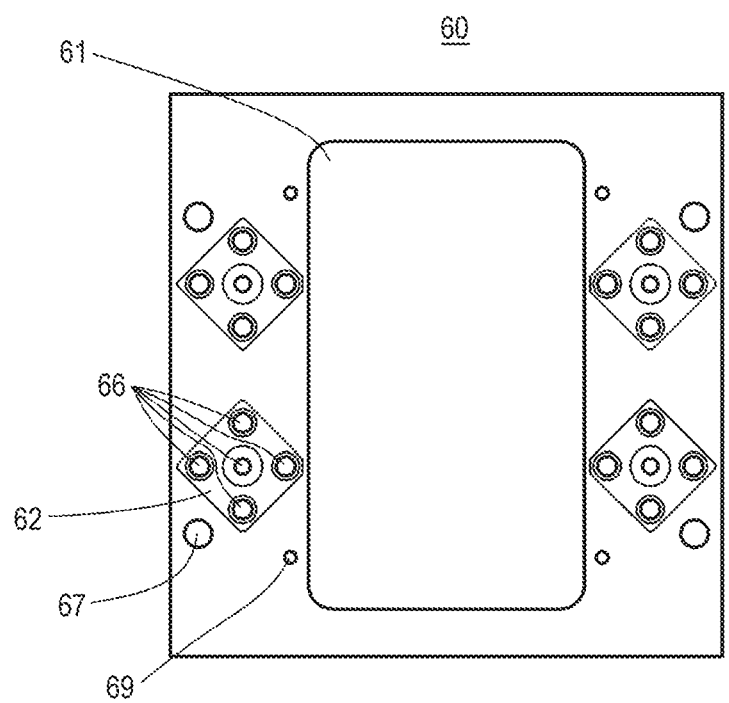
FIG. 10 is a plan view of a sub board 60 in the contact unit 30.
Figure 11:
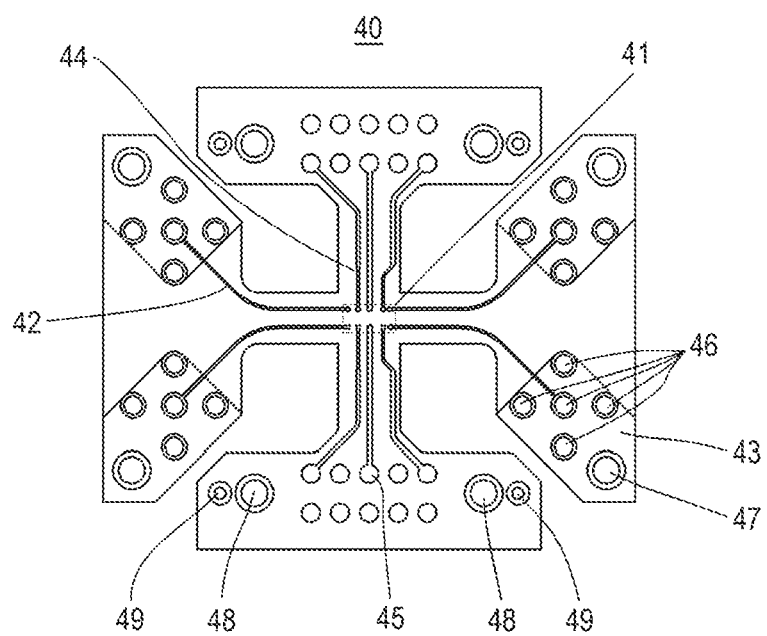
FIG. 11 is a plan view of a flexible board 40 in the contact unit 30, in which conductor patterns are shown in phantom.
Figure 12:
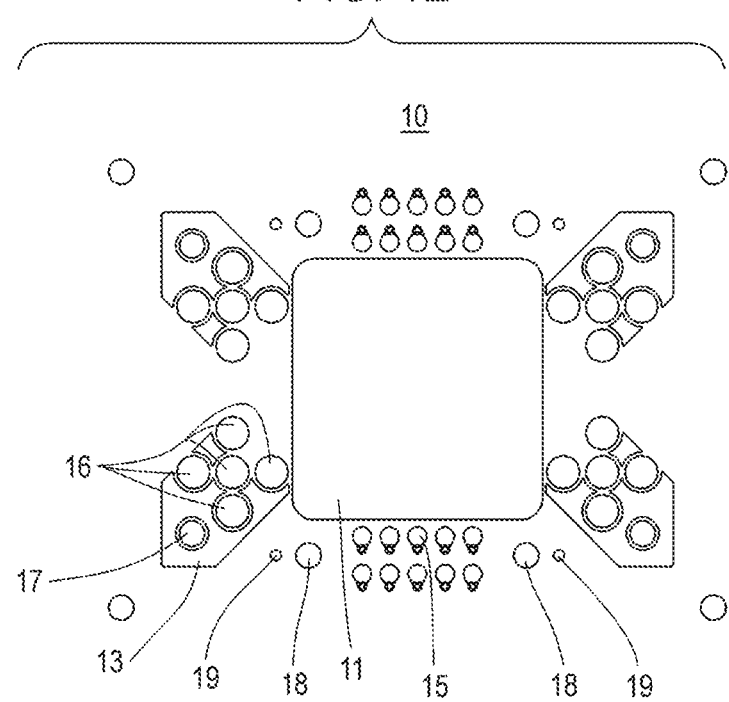
FIG. 12 is a partly enlarged plan view of a main board 10 in the inspection jig 1.
Figure 13:
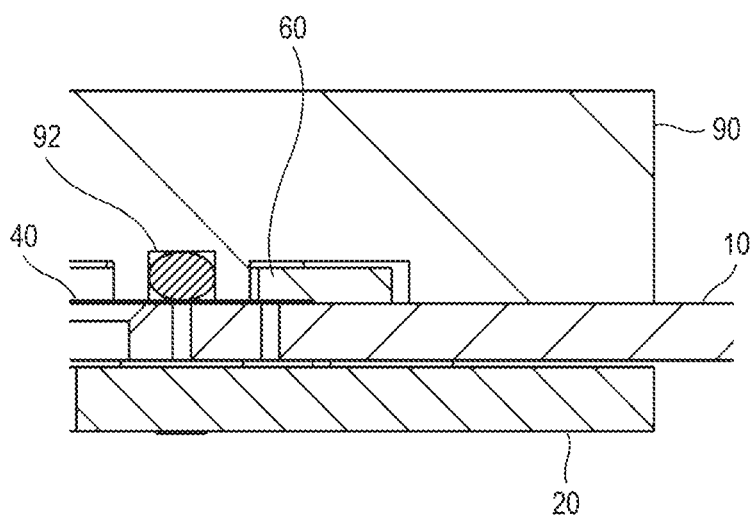
FIG. 13 is an enlarged sectional view of a region surrounding an elastic member 92 in the inspection jig 1.
Figure 14:
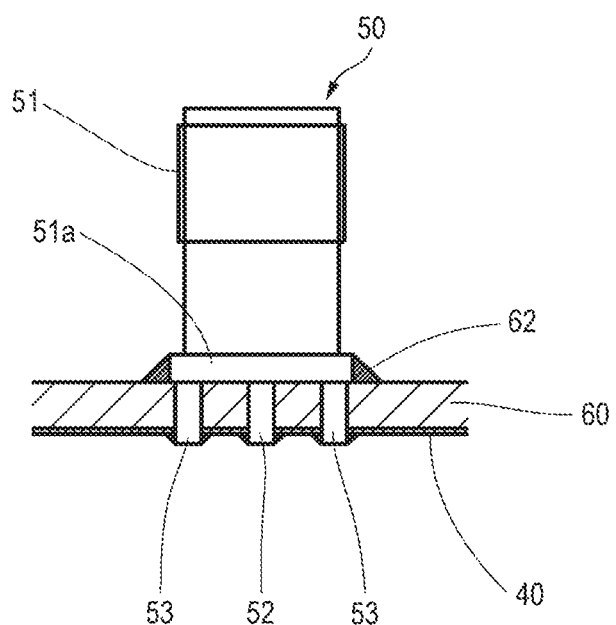
FIG. 14 is an enlarged sectional view of a region surrounding a coaxial connector 50 in the contact unit 30.

FIG. 1 is an exploded perspective view of a contact unit 30 in an embodiment according to the invention, as seen from the below. FIG. 2 is an exploded perspective view of the contact unit 30, as seen from the above. FIG. 3 is an exploded perspective view of an inspection jig 1 in the embodiment according to the invention, as seen from the below. FIG. 4 is an exploded perspective view of the inspection jig 1, as seen from the above. FIG. 5 is a perspective view of the inspection jig 1 in which a unit pressing member 90 is omitted, as seen from the below. FIG. 6 is a perspective view of the inspection jig 1 in which the unit pressing member 90 is omitted, as seen from the above. FIG. 7 is a plan view of the inspection jig 1. FIG. 8 is a sectional view taken along a line A-A in FIG. 7. FIG. 9 is a sectional view taken along a line B-B in FIG. 7. FIG. 10 is a plan view of a sub board 60 in the contact unit 30. FIG. 11 is a plan view of a flexible board 40 in the contact unit 30, in which conductor patterns are shown in phantom. In FIG. 11, the conductor patterns which are formed on a lower face of the flexible board 40 are shown in phantom from an upper face side of the flexible board 40. FIG. 12 is a partly enlarged plan view of a main board 10 in the inspection jig 1. FIG. 13 is an enlarged sectional view of a region surrounding an elastic member 92 in the inspection jig 1. FIG. 14 is an enlarged sectional view of a region surrounding a coaxial connector 50 in the contact unit 30.

The contact unit 30 is an exchangeable contact unit for an inspection jig such as a probe card, and detachably fixed to the main board 10 of the inspection jig 1, as shown in FIGS. 3, 4, and so on. The contact unit 30 includes the flexible board 40, four pieces of the coaxial connector 50 such as an SMA connector, the sub board 60 formed of a hard board such as a glass epoxy board, and a block 70 formed of, for example, a resin molded body.

The flexible board 40 is provided for coming into contact with an object to be inspected such as a wafer. The flexible board 40 is positioned on one face (a lower face) of the sub board 60. A contact part 41 (FIG. 1) to be contacted with the object to be inspected such as the wafer, signal patterns 42 (FIG. 11), ground patterns 43 (FIG. 11), and DC patterns 44 (FIG. 11) are provided on a lower face (the face at an opposite side to the sub board 60) of the flexible board 40. Moreover, through holes 45, connector leg passing holes 46, screw fastening holes 47, 48, and positioning holes 49 are formed in the flexible board 40. It is to be noted that the signal patterns 42 and the DC patterns 44 which are shown in FIG. 11 are omitted in the other drawings containing the flexible board 40, except FIG. 11. Moreover, the ground patterns 43 are omitted in the other drawings containing the flexible board 40, except FIG. 3 and FIG. 11. When the contact unit 30 is attached to the inspection jig 1, the flexible board 40 is not bonded to the below described main board 10 by soldering.

The contact part 41 is an assembly of bumps for signal and DC, and positioned at a center of a cross-shaped part of the flexible board 40. Respective one ends of the signal patterns 42 and the DC patterns 44 are merged into the bumps of the contact part 41. The other ends of the signal patterns 42 are directly and electrically connected to leg portions 52 for signal of the coaxial connectors 50 by soldering or so. There are provided the signal patterns 42 of the same number as that of the coaxial connectors 50. The other ends of the DC patterns 44 are merged into the through holes 45. The ground patterns 43 are so formed as to extend up to the connector leg passing holes 46 through which leg portions for ground of the coaxial connectors 50 are passed, and the screw fastening holes 47 which are arranged near the connector leg passing holes 46, on the lower face (the face opposed to the main board 10) of the flexible board 40, to be electrically connected with the leg portions 53 for ground of the coaxial connectors 50. Although not shown in FIG. 11, respective one part of the ground patterns 43 are provided up to a region near the contact part 41 in a manner of forming coplanar lines along with both sides of the signal patterns 42 which are extended up to the contact part 41. The through holes 45 are provided for establishing electrical connection between the DC patterns 44 and the main board 10.

The connector leg passing holes 46 are formed for allowing the leg portions 52 for signal and the leg portions 53 for ground of the coaxial connectors 50 to pass through. The screw fastening holes 47 are formed for allowing screws (fastening components) 107 for fixing the contact unit 30 to the main board 10 in the inspection jig 1 to pass through. It is to be noted that the screws 107 which are shown in FIGS. 1 and 2 are not necessarily constituent elements of the contact unit 30. The screw fastening holes 48 are provided for allowing screws (fastening components) 108 for fixing the unit pressing member 90 of the inspection jig 1 to the main board 10 to pass through. The screw fastening holes 48 are respectively provided at both sides of the through holes 45. The positioning holes 49 are provided for allowing positioning pins 109 (FIG. 4) for positioning the contact unit 30 with respect to the main board 10 to pass through. The positioning holes 49 are provided adjacent to the screw fastening holes 48.

The four coaxial connectors 50 are so positioned as to surround the contact part 41 of the flexible board 40, and directly and electrically connected to the flexible board 40. Coaxial cables which are extended from an inspection apparatus (a tester), which is not shown, can be detachably connected to the coaxial connectors 50. Each of the coaxial connectors 50 includes a main body 51, a single leg portion 52 for signal, and four leg portions 53 for ground. One end of the coaxial cable is connected to the inspection apparatus, and the other end thereof is detachably connected (attached) to the body part 51. The body part 51 is positioned on the other face (an upper face) of the sub board 60. A flange part 51a of the body part 51 is fixed to a connector fixing land 62 (omitted in FIG. 2) of the sub board 60 which is shown in FIG. 10, by soldering or so (FIG. 14). The leg portion 52 for signal and the leg portions 53 for ground are extended from the body part 51, pass through connector leg passing holes 66 in the sub board 60 and the connector leg passing holes 46 in the flexible board 40, and then, directly and electrically connected to the face of the flexible board 40 at an opposite side to the sub board 60 by soldering or so (FIG. 14). Specifically, the leg portion 52 for signal is directly and electrically connected to the signal patterns 42 of the flexible board 40, and the leg portions 53 for ground are directly and electrically connected to the ground patterns 43 of the flexible board 40. When the contact unit 30 is attached to the inspection jig 1, the coaxial connectors 50 are not bonded to the main board 10, which will be described below, by soldering.

The sub board 60 as a support board (a hard board) is provided for the purpose of preventing a large load from being applied to a bonded part (a soldered part) between the flexible board 40 and the coaxial connector 50, on occasion of attaching or detaching the coaxial cable to the coaxial connector 50. The sub board 60 is provided with a center through hole 61, the connector fixing lands 62 (FIG. 10), the connector leg passing holes 66, screw fastening holes 67, and positioning holes 69. The center through hole 61 provides a space for arranging the block 70. The connector fixing lands 62 are provided on the upper face of the sub board 60 for the purpose of fixing the coaxial connector 50 by soldering or so. The connector leg passing holes 66 are provided for the purpose of inserting the leg portions 52 for signal and the leg portions 53 for ground of the coaxial connectors 50. The screw fastening holes 67 are provided for the purpose of passing the screws 107 for fixing the contact unit 30 to the main board 10 of the inspection jig 1. The positioning holes 69 are provided for the purpose of inserting the positioning pins 109 (FIG. 4) for positioning the contact unit 30 to the main board 10.

The block 70 is urged downward by a spring 91, in a state incorporated in the inspection jig 1, thereby to hold the flexible board 40 in such a state that the contact part 41 is protruded downward from the main board 10. The block 70 has four leg portions 72 around a center pyramid part 71 which is convexed downward. Parallelism adjusting screws 73 are respectively attached to the leg portions 72 of the block 70. Tip ends of the parallelism adjusting screws 73 are contacted with a base part 22 for block of a retainer 20 which will be described below. Vertical position of the block 70 which is urged by the spring 91 is determined, when the tip ends of the parallelism adjusting screws 73 come into contact with the base part 22 for block of the retainer 20. Two positioning pins 103 are held by the block 70 to be projected upward. The positioning pins 103 has a function of positioning the unit pressing member 90, which will be described below, with respect to the contact unit 30. Although the spring 91 is shown at an upper side than the block 70 in FIG. 2, the spring 91 may be held by the unit pressing member 90 of the inspection jig 1 by bonding or so, and need not be absolutely a constituent element of the contact unit 30.

The inspection jig 1 is a probe card, for example, and used for inspecting electrical performance of a semiconductor integrated circuit in a state of a wafer. The inspection jig 1 includes the main board 10 formed of, for example, glass epoxy board, the retainer 20 formed of metal such as stainless steel or the like, the above described contact unit 30, and the unit pressing member 90 formed of, for example, a resin molded body.

The main board 10 is provided with a through hole 11 for contact, through holes 15, connector leg passing holes 16, screw fastening holes 17, 18, and positioning holes 19 (FIG. 12). The through hole 11 for contact is provided for the purpose of allowing the contact part 41 of the flexible board 40 to protrude downward. The through holes 15 are provided for establishing electrical connection with the through holes 45 which form the one ends of the DC patterns 44 of the flexible board 40. The connector leg passing holes 16 are provided for the purpose of avoiding the leg portions 52 for signal and the leg portions 53 for ground of the coaxial connectors 50. The screw fastening holes 17 are provided for the purpose of passing the screws 107 for fixing the contact unit 30 to the main board 10. The screw fastening holes 18 are provided for the purpose of passing the screws 108 for fixing the unit pressing member 90 to the main board 10. The positioning holes 19 as shown in FIG. 12 are provided for the purpose of passing the positioning pins 109 (FIG. 4) for positioning the contact unit 30 with respect to the main board 10. Ground patterns 13 are provided on the upper face (the face opposed to the flexible board 40) of the main board 10 around the connector leg passing holes 16 and the screw fastening holes 17. By fastening the contact unit 30 to the main board 10 with the screws 107, the ground patterns 13 of the main board 10 and the ground patterns 43 of the flexible board 40 come into face contact with each other. The ground patterns 13, 43 are provided around the screw fastening holes 17, 47, and hence, the ground patterns 13, 43 are firmly brought into face contact with each other, particularly in regions around the positions where they are fastened with the screws 107.

The retainer 20 is a thin sheet metal, for example, and has a function of restricting a downwardly protruding amount of the contact unit 30 from the main board 10. The retainer 20 is attached (fixed) to the lower face of the main board 10 with screws (fastening members) 106. The retainer 20 is provided with a through hole 21 for contact in a shape of a cross, and screw holes 27, 28. The base parts 22 for block (FIG. 4) are formed around the through hole 21 for contact. The through hole 21 for contact is provided for the purpose of allowing the contact part 41 of the flexible board 40 to protrude downward. The screw holes 27 are adapted to be engaged with the screws 107 for fixing the contact unit 30 to the main board 10 of the inspection jig 1. The screw holes 28 are adapted to be engaged with the screws 108 for fixing the unit pressing member 90 to the main board 10. The base parts 22 for block are respectively positioned below the leg portions 72 of the block 70, and receive (support) the tip ends of the parallelism adjusting screws 73 which are attached to the leg portions 72 and extended downward from the leg portions 72. Positioning pins 104 and the aforesaid positioning pins 109 are provided on the retainer 20 and projected upward from the upper face of the main board 10. The positioning pins 104 have a function of positioning the unit pressing member 90 with respect to the main board 10. The positioning pins 109 have a function of positioning the contact unit 30 with respect to the main board 10. The main board 10 and the retainer 20 compose the main body of the inspection jig 1.

The unit pressing member 90 is a member for pressing the contact unit 30 from the above. The unit pressing member 90 is provided with positioning holes 93, 94, connector body passing holes 95, and a recess 96 for spring (FIG. 3). The positioning holes 93 are provided for the purpose of passing the positioning pins 103 for positioning the unit pressing member 90 with respect to the contact unit 30. The positioning holes 94 are provided for the purpose of passing the positioning pins 104 for positioning the unit pressing member 90 with respect to the main board 10. The connector body passing holes 95 are provided for the purpose of protruding the body parts 51 of the coaxial connectors 50 upward. The recess 96 for spring is provided for the purpose of supporting one end of the spring 91 which is shown in FIG. 2. The spring 91 urges the block 70 downward (that is, urges the contact part 41 of the flexible board 40 downward) in a state where the unit pressing member 90 is fixed to the main board 10 with the screws 108, thereby to apply a contact force against the object to be inspected such as the wafer to the contact part 41 of the flexible board 40. Two pieces of the elastic member 92 (FIG. 3) formed of silicone rubber or the like in a shape of a cord (a linear shape) are held on the lower face (the face opposed to the flexible board 40) of the unit pressing member 90. The elastic members 92 are provided at positions directly above the through holes 45 of the flexible board 40 and the through holes 15 of the main board 10, and press the through holes 45 of the flexible board 40 toward the through holes 15 of the main board 10, in a state where the unit pressing member 90 is fixed to the main board 10 with the screws 108. The screws 108 fix the unit pressing member 90 to the main board 10 at both sides of the elastic members 92 respectively, and hence, pressing effects by the elastic members 92 are enhanced. The through holes 15, 45 are brought into pressure contact with each other by the elastic members 92 thereby to be electrically connected.

A flow of an assembling work of the inspection jig 1 will be described below.

As a first step, the contact unit 30 is assembled in advance. Specifically, the following steps are carried out. The leg portions 52 for signal and the leg portions 53 for ground of the coaxial connectors 50 are passed through the connector leg passing holes 66 in the sub board 60, and the flange parts 51a of the coaxial connectors 50 are fixed to the connector fixing lands 62 on the upper face of the sub board 60 by soldering or so. Thereafter, while the leg portions 52 for signal and the leg portions 53 for ground of the coaxial connectors 50 are passed through the connector leg passing holes 46 in the flexible board 40 to which the block 70 has been already bonded, the flexible board 40 is set on the lower face (the face at an opposite side to the face where the body parts 51 of the coaxial connectors 50 are fixed) of the sub board 60. Then, the leg portions 52 for signal and the leg portions 53 for ground of the coaxial connectors 50 are connected directly and electrically to the lower face (the face at the opposite side to the sub board 60) of the flexible board 40 by soldering or so. It is also possible to fix the flange parts 51a of the coaxial connectors 50 to the upper face of the sub board 60 (the connector fixing lands 62), after the leg portions 52 for signal and the leg portions 53 for ground of the coaxial connectors 50 have been electrically connected to the lower face of the flexible board 40 in advance. The flexible board 40 is indirectly fixed to the sub board 60, because the leg portions 52 for signal and the leg portions 53 for ground of the coaxial connectors 50 are fixed to the sub board 60 by soldering. In this manner, the assembling work of the contact unit 30 is completed. It is to be noted that the block 70 may be passed through the center through hole 61 of the sub board 60, and fixed to the back face of the contact part 41 of the flexible board 40 by bonding, in a final step.

Then, the contact unit 30 is attached (fixed) to the main board 10 with the screws 107. Specifically, the four positioning pins 109 projected from the main board 10 are respectively passed through the positioning holes 49 in the flexible board 40 and the positioning holes 69 in the sub board 60. At the same time, the four screws 107 are respectively passed through the screw fastening holes 67 in the sub board 60, the screw fastening holes 47 in the flexible board 40, and the screw fastening holes 17 in the main board 10, and screwed into the screw holes 27 in the retainer 20 which has been fixed to the lower face of the main board 10 in advance. In this manner, the flexible board 40 is clamped between the main board 10 and the sub board 60.

Then, the unit pressing member 90 is fixed to the main board 10 with the screws 108. Specifically, the two positioning pins 103 which are projected upward from the block 70 and the two positioning pins 104 which are projected upward from the main board 10 are respectively passed through the positioning holes 93, 94 in the unit pressing member 90. At the same time, the four screws 108 are passed through the screw fastening holes in the unit pressing member 90, the screw fastening holes 48 in the flexible board 40 and the screw fastening holes 18 in the main board 10, and screwed into the screw holes 28 in the retainer 20. The parallelism of the contact part 41 of the flexible board 40 is adjusted by turning the parallelism adjusting screws 73, according to necessity. In this manner, the assembling work of the inspection jig 1 is completed. It is to be noted that the contact unit 30 can be detached from the main board 10 by conducting the assembling steps in a reverse order.

According to this embodiment, the following advantages can be obtained.

(1) Because the coaxial connectors 50 are directly and electrically connected to the signal patterns 42 of the flexible board 40 which has the contact part 41 with respect to the object to be inspected such as the wafer, it is possible to transmit the electric signals at high frequency without electrical connection by the pressure contact between the main board 10 and the flexible board 40, and hence, it is possible to restrain deterioration of the electrical performance. Therefore, it is possible to realize the contact unit 30 capable of restraining deterioration of the electrical performance in the inspection jig 1, and the inspection jig 1 capable of restraining deterioration of the electrical performance.

(2) The contact unit 30 is attached (fixed) to the main board 10 with the screws 107 which pass through the sub board 60 and the flexible board 40, and on the other hand, the flexible board 40 and the coaxial connectors 50 are not bonded to the main board 10 by soldering or so. Therefore, the exchanging (attaching or detaching) work of the contact unit 30 is easily carried out, because the screws 107 have only to be attached or detached on occasion of exchanging the contact unit 30, and the solders need not be removed. As the results, it is possible to realize the contact unit 30 which can be easily attached to or detached from the main body of the inspection jig 1, and the inspection jig 1 in which the flexible board 40, which is the consumable supply, can be easily exchanged.

(3) Because the coaxial connectors 50 are fixed to the sub board 60 by soldering or so, it is possible to prevent a large load from being applied to the bonded parts (the soldered parts) between the flexible board 40 and the coaxial connectors 50, on occasion of attaching or detaching the coaxial cables. In this connection, in case where the coaxial connectors 50 are fixed to the main board 10 by soldering or so, easiness in attaching or detaching the contact unit 30 is hindered. However, it is possible to secure the easiness in attaching or detaching the contact unit 30, by fixing the coaxial connectors 50, by soldering or so, to the sub board 60 which is provided separately from the main board 10. Moreover, in case where the coaxial connectors 50 are fixed to the main board 10 by screwing or so, the large flange parts are required, and this is unrealistic from a view point of space securing. However, it is possible to firmly fix the coaxial connectors 50 to the main board 10 within a limited space, by fixing them to the sub board 60 by soldering or so.

(4) Because the ground patterns 13 of the main board 10 and the ground patterns 43 of the flexible board 40 are extended up to the regions around the screw fastening holes 17, 47, it is possible to forcibly bring the ground patterns 13, 43 into face contact with each other in the region around the positions where they are fixed with the screws 107, by clamping the flexible board 40 between the main board 10 and the sub board 60. As the results, the electrical connection between the leg portions 53 for ground of the coaxial connectors 50 and the ground patterns 13 of the main board 10 can be easily and reliably performed.

(5) Because the elastic members 92 which are provided on the unit pressing member 90 press the flexible board 40 against the main board 10 thereby to bring the through holes 45 in the flexible board 40 into pressure contact with the through holes 15 in the main board 10, it is possible to electrically connect the through holes 15, 45 to each other easily and reliably. In this case, because the screws 108 for fixing the unit pressing member 90 to the main board 10 are provided at both sides of the elastic members 92, the flexible board 40 can be pressed with the elastic members 92 with enhanced pressing effect.

The invention has been heretofore described referring to the embodiment as an example. However, it is to be understood by those skilled in the art that various modifications can be added to the constituent elements and the treating processes in the embodiment. The modifications will be briefly described below.

It is also possible to use the inspection jig 1 for inspecting the electrical performance of a semiconductor integrated circuit which is divided in individual parts. The contact unit 30 need not be provided with the sub board 60. In this case, the number of the components is reduced, although the contact unit 30 is weakened against the load which is applied on occasion of attaching or detaching the coaxial cables. Besides, parameters such as the number of the coaxial connectors 50, the number of the through holes, the number of the screws for fixing the respective parts, and the number of the positioning pins are not limited to the specific numbers which are described as examples in the embodiment, but can be optionally determined according to required performances and convenience in designing.

According to an aspect of the invention, it is possible to provide the exchangeable contact unit which can be easily attached to or detached from the inspection jig such as a probe card, and can restrain deterioration of electrical performance in the inspection jig.

According to an aspect of the invention, it is possible to provide the inspection jig in which the flexible board, which is a consumable supply, can be easily exchanged, while restraining deterioration of electrical performance.

What is claimed is:

1. An exchangeable contact unit which can be attached to or detached from a main body of an inspection jig, the exchangeable contact unit comprising:
   a flexible board which is provided with a contact part with respect to an object to be inspected;
   a coaxial connector which is directly and electrically connected to the flexible board; and
   a support board to which the coaxial connector is fixed,
   wherein the coaxial connector includes a body part to which a coaxial cable is detachably connected and a leg portion which passes through the flexible board and is directly and electrically connected to a pattern of the flexible board;
   wherein the flexible board is positioned on one face side of the support board, the body part is positioned on the other face side of the support board, the leg portion is extended from the body part to pass through the support board and the flexible board, and the contact unit is detachably fixed to the main body of the inspection jig in such a manner that the flexible board is clamped between a board of the inspection jig and the support board; and
   wherein a ground pattern which is electrically connected to a leg portion for ground of the coaxial connector is provided on a face of the flexible board at an opposite side to the support board and extended up to a region around a through hole for fixing the flexible board to the main body of the inspection jig.

2. The exchangeable contact unit according to claim 1, further comprising:
   a plurality of patterns formed on a same surface of the flexible board as the contact part.

3. The exchangeable contact unit according to claim 2, wherein at least two of the plurality of patterns are arranged symmetrically with respect to the contact part.

4. The exchangeable contact unit according to claim 1, wherein the flexible board includes a recess portion in a center of the flexible board where the contact part is formed.

5. The exchangeable contact unit according to claim 1, wherein the leg portion of the coaxial connector includes a single leg for a signal, and four legs for ground.

6. The exchangeable contact unit according to claim 1, wherein the leg portion of the coaxial connector passes through the support board.

7. An inspection jig comprising:
   a contact unit which includes: a flexible board provided with a contact part to be contacted with an object to be inspected; and a coaxial connector which is directly and electrically connected to the flexible board;
   a main board to which the contact unit is detachably fixed; and
   an urging member which is configured to apply a contact force with respect to the object to be inspected to the contact part, wherein
   the flexible board and the coaxial connector are not bonded to the main board, wherein the coaxial connector includes a body part to which a coaxial cable is detachably connected and a leg portion which passes through the flexible board and is directly and electrically connected to a pattern of the flexible board;

wherein the contact unit is provided with a support board, and the coaxial connector is fixed to the support board;

wherein the flexible board is clamped between the main board and the support board; and wherein the main board, the flexible board and the support board are fixed to each other by fastening components; ground patterns for the coaxial connector are respectively provided on faces of the main board and the flexible board which are opposed to each other, so as to extend around fixed positions where they are fixed by the fastening components; and the ground patterns are in face contact with each other, in regions around the fixed positions.

8. The inspection jig according to claim 7, further comprising: a unit pressing member which is fixed to the main board and is configured to support one end of the urging member, wherein the flexible board is positioned between the main board and the unit pressing member, and the unit pressing member is provided with an elastic member for pressing the flexible board against the main board thereby to electrically connect them to each other.

9. The inspection jig according to claim 8, wherein the unit pressing member is fixed to the main board by fastening components at both sides of the elastic member.

10. The exchangeable contact unit according to claim 7, further comprising:

a plurality of patterns formed on a same surface of the flexible board as the contact part.

11. The exchangeable contact unit according to claim 10, wherein at least two of the plurality of patterns are arranged symmetrically with respect to the contact part.

12. The exchangeable contact unit according to claim 7, wherein the flexible board includes a recess portion in a center of the flexible board where the contact part is formed.

13. The exchangeable contact unit according to claim 7, wherein the leg portion of the coaxial connector includes a single leg for a signal, and four legs for ground.

14. The inspection jig according to claim 7, wherein the leg portion of the coaxial connector passes through the support board.

* * * * *